(12) United States Patent
Jensen et al.

(10) Patent No.: US 6,225,887 B1
(45) Date of Patent: *May 1, 2001

(54) GENERATION OF HIGHLY UNIFORM MAGNETIC FIELDS WITH MAGNETIZED WEDGES

(75) Inventors: Jens Jensen, Yonkers; Manlio G. Abele, New York; Henry Rusinek, Great Neck, all of NY (US)

(73) Assignee: New York University, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/885,095

(22) Filed: Jun. 30, 1997

Related U.S. Application Data

(63) Continuation-in-part of application No. 08/754,916, filed on Nov. 22, 1996, now Pat. No. 5,790,006.

(51) Int. Cl.[7] ........................................................ H01F 7/02
(52) U.S. Cl. ............................................ 335/306; 335/301
(58) Field of Search ..................................... 335/296–306; 324/318–320

(56) References Cited

U.S. PATENT DOCUMENTS

| 5,055,812 | * | 10/1991 | Abele et al. | 335/210 |
| 5,107,239 | * | 4/1992 | Abele | 335/306 |
| 5,278,534 | | 1/1994 | Abele et al. | 335/306 |
| 5,428,333 | | 6/1995 | Abele et al. | 335/306 |
| 5,438,264 | * | 8/1995 | Takeshima et al. | 324/319 |
| 5,467,769 | * | 11/1995 | Yoshino et al. | 335/306 |
| 5,475,355 | | 12/1995 | Abele et al. | 335/301 |
| 5,495,222 | | 2/1996 | Abele et al. | 335/306 |
| 5,790,006 | * | 8/1998 | Abele et al. | 335/306 |

* cited by examiner

Primary Examiner—Ray Barrera
(74) Attorney, Agent, or Firm—Darby & Darby

(57) ABSTRACT

A magnetic structure generating a substantially uniform magnetic field within a region of interest using permanently magnetized wedge-shaped blocks of magnetic material. In a preferred embodiment, the permanently magnetized wedge-shaped blocks are provided in pairs positioned on opposite sides of the x z plane of an arbitrary x,y,z coordinate system, and each of the blocks are magnetized in certain directions. The uniform field is created in the vicinity of the z axis. In another embodiment, the parts of the structure below the x-axis are replaced by a high-permeability, soft magnetic plate to form a so-called mirror system. In still another embodiment, permanently magnetized blocks positioned outside of the wedge-shaped blocks are employed as the main compensation means for field distortions arising from the practical need to truncate the wedge-shaped blocks to a practical size. An important application for the magnetic structure of the invention is MRI, as it can be configured as an open structure accessible to medical intervention during the MRI.

23 Claims, 10 Drawing Sheets

GENERATION OF HIGHLY UNIFORM MAGNETIC FIELDS WITH MAGNETIZED WEDGES

RELATED APPLICATION

This application is a continuation-in-part of a commonly assigned patent application, Ser. No. 08/754,916, filed Nov. 22, 1996, now U.S. Pat. No. 5,790,006.

The invention is directed to apparatus for generating highly uniform magnetic fields using permanently magnetized wedge-shaped blocks of magnetic material as a major contributor of the uniform magnetic field in a desired region of interest.

BACKGROUND OF INVENTION

The related copending application, Ser. No. 08/754,916, whose contents, including the contents of the patents incorporated by reference in the said copending application, are herein incorporated by reference, describes apparatus for generating uniform magnetic fields in a region of interest employing wedge-shaped blocks as the primary generator of the main magnetic field. The copending application also describes supplying a high-permeability soft magnetic material member (referred to therein as a $\mu=\infty$ material) positioned along one side of a magnetic structure comprising the wedge-shaped blocks, which has the effect of canceling the field on the back side of the high-permeability member thus concentrating the field on only one side of the structure. An important application for such apparatus is in magnetic resonance imaging (MRI) equipment for medical diagnosis, where a highly uniform magnetic field is essential to obtain high resolution images. As used herein, the term "uniform magnetic field" or "highly uniform magnetic field" means a magnetic field intensity H in a region of interest substantially satisfying the relationship $(Hmax-Hmin)/Havg \leq 10^{-4}$, equivalent to the field intensity H over the region of interest varying less than 100 ppm. As is explained in the copending application, when the wedge-shaped blocks satisfy certain magnetization and geometrical conditions, the desired uniform magnetic field will be realized when the blocks extend over a very large distance in the y and z directions of the arbitrary x,y,z coordinate system used to define the configuration of the magnetic structure. This is impractical in a usual implementation, and thus the blocks have to be shortened or truncated in the y and z directions. This action introduces distortions in the uniformity of the magnetic field in the region of interest. The copending application also describes one scheme for compensating such distortions using concepts described in a commonly-owned patent U.S. Pat. No. 5,495,222. Another commonly owned patent U.S. Pat. No. 5,428,333 describes another scheme for compensating for distortions in a uniform magnetic field produced by a magnetic structure based on the use of rectangular permanently magnetized blocks, in which a series of slits are introduced into the rectangular permanently magnetized blocks as the compensation means. This latter scheme cannot be used in a magnetic structure based on the wedge-shaped blocks of the present invention.

SUMMARY OF INVENTION

A principal object of the invention is apparatus for generating a uniform magnetic field in a region of interest employing wedge-shaped blocks to generate the main magnetic field.

Another object of the invention is apparatus for generating a uniform magnetic field in an enclosed region of interest employing wedge-shaped blocks wherein the overall size of the apparatus is reduced.

Still another object of the invention is apparatus for generating a uniform magnetic field in a region of interest employing wedge-shaped blocks as a major contributor of the main magnetic field and further comprising compensation means to improve the field uniformity in the region of interest.

A further object of the invention is apparatus for generating a uniform field in a region of interest using wedge-shaped blocks and further comprising compensation means for field distortions wherein the compensation means are provided separately from the wedge-shaped blocks and together supply the main field in the region of interest.

These and other objects are achieved in accordance with one aspect of the invention by apparatus for generating a highly uniform magnetic field using permanently magnetized wedge-shaped blocks of magnetic material as the major contributor of a magnetic field generated in a desired region of interest. In a preferred embodiment, the permanently magnetized wedge-shaped blocks are provided in symmetrical pairs positioned on opposite sides of the xz plane of an arbitrary x,y,z coordinate system, and each of the blocks of a pair are substantially uniform magnetized in certain directions such that their respective y axis components of their magnetization J extend in the same direction but their respective x axis components of their magnetization J extend in opposite directions. In addition, the blocks are contacted on one side by a high-permeability member to cancel the field on the back side of the latter and concentrate it in the region of interest.

In accordance with another aspect of the invention, the parts of the structure below the xz plane are replaced by a high-permeability, soft magnetic plate to form a so-called mirror system wherein the resultant magnetic field in the region of interest is as if the plate were replaced by the second wedge of the full wedge structure; however, since only one-half of the amount of permanently magnetized material is actually present in this mirror system, the region of interest is reduced in size by about one-half.

In accordance with a further aspect of the invention, the magnetic structure using wedge-shaped blocks as a major contributor to the field generated employs permanently magnetized blocks positioned separately from the wedge-shaped blocks as the main compensation means for field distortions arising from the practical need to truncate the wedge-shaped blocks to a practical size.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals or letters signifying the same or similar components.

DETAILED DESCRIPTION OF PREFERRED EMBODIMENTS

I. Introduction

Figure 2:
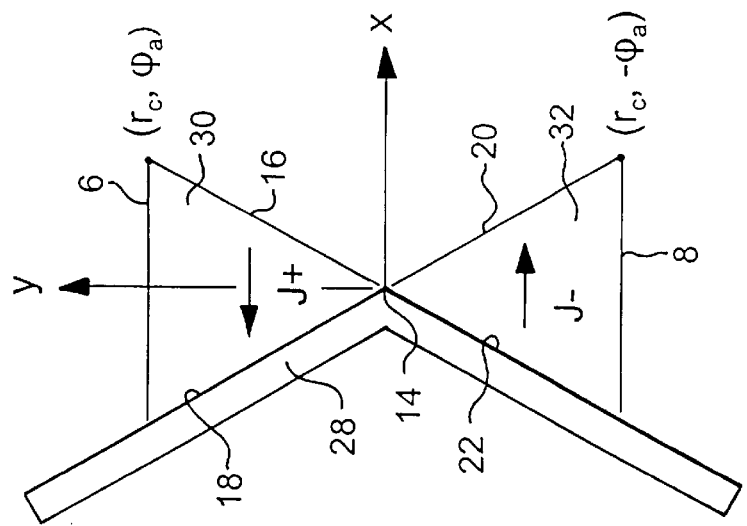
FIG. 2 is a schematic view of the structure depicted in FIG. 1 but with the wedge-shaped blocks truncated.

This application describes apparatus and a method for using permanently magnetized material to generate highly uniform magnetic fields. The invention yields structures that consist of a central pair of uniformly magnetized wedges to provide a substantial portion of the magnetic field in a region of interest and, in certain preferred embodiments, pairs of uniformly magnetized compensating blocks are provided that also contribute to the field and enhance the field uniformity. These structures differ markedly from conventional magnetic structures, which generate a uniform field in a gap between two parallel generally rectangular blocks of magnetized material. In particular, practical wedge structures can be designed to allow access to the region of high field uniformity over a solid angle approaching $2\pi$ steradians. This high degree of access may be useful, for example, in combining MRI of the human body with interventional medical procedures.

The compensation scheme described herein is based on a harmonic expansion of the magnetostatic potential. The sizes and locations of the compensating blocks are chosen to eliminate the dominant terms of the expansion corresponding to a distortion of the field. The calculation of the block geometry is accomplished by finding the root of a nonlinear algebraic equation. To illustrate the method of the invention and to describe possible implementations, several examples are discussed in detail, with both the dimensions of the compensating blocks and the size of the region of high field uniformity being determined, though it is understood that the invention is not limited to those examples. Furthermore, an analysis of the figure of merit for wedge magnets is provided that shows how to optimize their efficiency. The most attractive structures suggested by the method use a lower remanence material for the central wedges and a higher remanence material for the compensating blocks. This combination of low and high remanence materials allows remarkably compact structures to be designed. In practice, the lower remanence material could be a hard ferrite, which typically have a remanence with a magnitude of 0.35 T to 0.40 T, while the higher remanence material could be a rare earth alloy such as Nd.Fe.B with a remanence of 1.0 T to 1.4 T. With ferrite and Nd.Fe.B selected as the magnetic materials, the examples presented generate fields in the range of 0.1 T to 0.3 T.

The main part of the description following assumes ideal magnetized material, for which the magnetic intensity H, the magnetic flux B, and the remanence $J_0$ obey the relation.

$$B = \mu_0 H + J_0, \qquad (1.1)$$

where $\mu_0$ is the vacuum permeability. The modifications of the method needed to account for a difference between the material's magnetic permeability $\mu$ and the vacuum value $\mu_0$ are discussed in Sec. VII. For the most commonly used magnetic materials, such as ferrites and rare earth, $\mu/\mu_0 \approx 1.1$, and the effects of the deviation of $\mu$ from $\mu_0$ are small.

II. Ideal Wedge Magnet Structure

Figure 1:
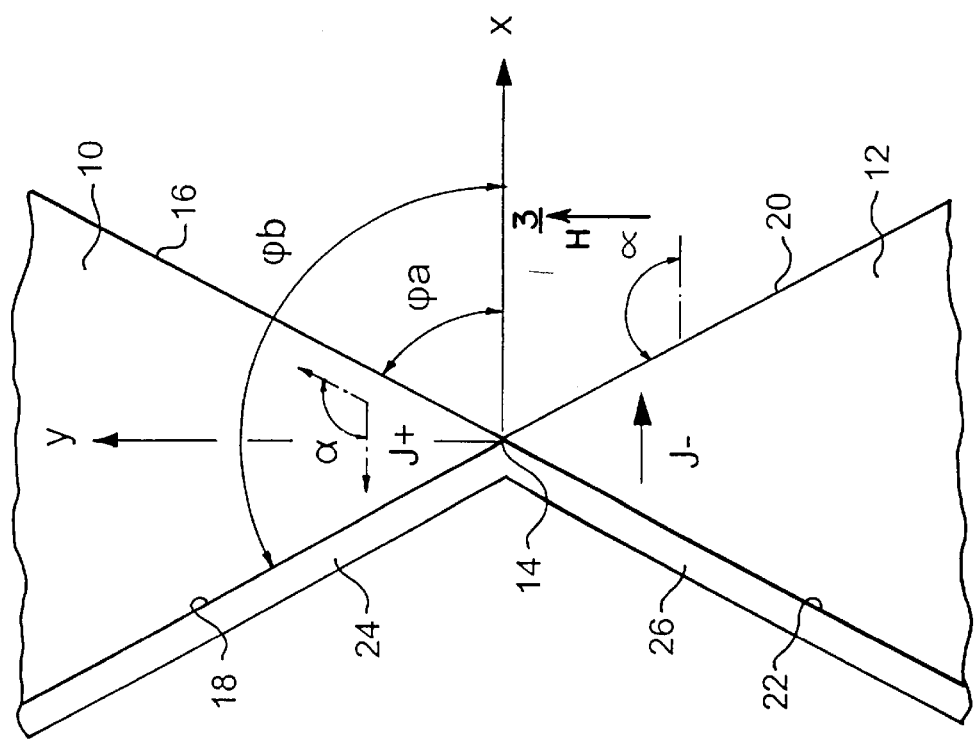
FIG. 1 is a schematic view of one form of magnetic structure with wedge-shaped blocks in accordance with the invention in order to explain the underlying principles.

An ideal wedge magnet structure, depicted in FIG. 1, comprises two infinite wedges 10, 12 of uniformly magnetized material. The structure, for convenience, will be described in the context of an arbitrary xyz coordinate system whose axes intersect at an origin 14, but it will be understood that the invention is not limited to such orientation. The corners of the wedges coincide at the origin 14, forming a line perpendicular to the plane of the drawing which we take as the z axis. The upper wedge 10 fills the region between $\phi = \phi_a$ and $\phi = \phi_b$, where $\phi(-\pi < \phi \leq \pi)$ is the angle from the x axis and $0 < \phi_a < \phi_b < \pi$, while the lower wedge 12 fills the region $-\phi_b < \phi < -\phi_a$. For further clarification, the wedge side 16 forming the angle $\phi_a$ with the xz plane is termed the first side of the wedge, and the wedge side 18 forming the angle $\phi_b$ with the xz plane is termed the second side of the wedge. The angle subtended by the first and second sides 16, 18 of the upper wedge 10 is $\phi_b - \phi_a$. The corresponding sides and angles for the lower wedge 12 are designated 20, 22, and the subtended angle is $\phi_b - \phi_a$. The remanences in the upper wedge, $J_{+1}$ and the lower wedge, $J_{-1}$ are given by $$J_+ = J_1 \cos(\alpha+\phi_\alpha)\hat{x} + J_1 \sin(\alpha+\phi_\alpha)\hat{y},$$
$$J_- = -J_1 \cos(\alpha+\phi_\alpha)\hat{x} + J_1 \sin(\alpha+\phi_\alpha)\hat{y}, \quad (2.1)$$

where $\hat{x}$ is a unit vector oriented in the x direction and $\hat{y}$ is a unit vector oriented in the y direction. As implied by equation 2.1, $J_1$ is the magnitude of the remanences of the wedges. The angle $\alpha$, which gives the orientation of $J_+$ relative to the surface 16, $\phi=\phi_a$, is restricted so that $0<\alpha<\pi$.

Added to the wedges are a pair of semi-infinite ferromagnetic plates 24, 26 covering the surface 18 and 22, $\phi=\pm\phi_b$. The ferromagnetic plates 24, 26 are assumed to have an infinite permeability, which means that the magnetostatic potential is constant on the plates independent of the distribution of magnetic material. (The behavior of infinite permeability ferromagnetic material can be approximated to a high degree of accuracy by soft iron as long as it is not magnetically saturated.) The ferromagnetic plates 24, 26 serve as the yoke for the wedge magnet as they channel the return flux. The ferromagnetic plates 24, 26 can be integrated into a single soft ferromagnetic member, which from time to time may be referenced by the single reference numeral 28.

In an open region 3 between the first sides of the two wedges 10, 12, $|\phi|<\phi_a$, the wedge magnets generate a uniform magnetic field intensity $$H = K \frac{J_1}{\mu_0} \hat{y}, \quad (2.2)$$

where $$K = \frac{\sin\alpha}{\sin\phi_b} \sin(\phi_b - \phi_a), \quad (2.3)$$

while for $\phi_a < \pm\phi < \phi_b$, $$H = K' \frac{J_1}{\mu_0} (\pm\sin\phi_b \hat{x} - \cos\phi_b \hat{y}), \quad (2.4)$$

where $$K' = \frac{\sin\alpha}{\sin\phi_b} \sin\phi_a. \quad (2.5)$$

Important special cases are (a) $\alpha=\pi/2$, which maximizes the field strength for fixed $\phi_a$, and (b) $\alpha=(\phi_b-\phi_a+\pi/2)$, which simplifies construction of the structure, and (c) $\alpha=\phi_b$, for which it can be shown that the flux in the region $\phi_a<\pm\phi<\phi_b$ either vanishes or is directed parallel to the surface $\phi=\pm\phi_b$. Note that $\phi_a$, $\phi_b$, and $\alpha$ may be chosen so that the magnitude of the flux in the open region 30 exceeds the magnitude of the remanence $J_1$.

Taking the potential of the ferromagnetic plates 26, 28 to be zero, the potential in the open region 3 corresponding to the field (2.2) is $$\phi_0 = -K \frac{J_1}{\mu_0} y. \quad (2.6)$$

The following sections show how a truncation of the wedge magnets 10, 12 distorts the ideal potential (2.6) and how to minimize this distortion in the vicinity of the corners 14 of the wedges by the addition of compensating blocks.

III. Two-Dimensional Truncation

First consider a truncation defined by the elimination of all the magnetic material in the region satisfying $$\frac{x}{x_c} + \frac{|y|}{y_c} > 1. \quad (3.1)$$

As (3.1) is independent of z, the magnet still has an infinite extent in the z direction, and the calculation of the field may treated as a two-dimensional problem. The ferromagnetic plates 24, 26 are assumed not to be truncated, although this is largely a mathematical convenience, as the effect of the ferromagnetic material more than a short distance beyond the extent of the magnetic material is small.

The distortion of the potential caused by the truncation (3.1) can be expanded in circular harmonics. The total potential $\phi$ can then be written $$\phi = \phi_0 + \frac{J_1 r_c}{\mu_0} \sum_{n=1}^{\infty} a_n \left(\frac{r}{r_c}\right)^{n\nu} \sin(n\nu\phi), \quad (3.2)$$

where $$\nu = \frac{\pi}{\phi_b}, \quad (3.3)$$

$$r = \sqrt{x^2 + y^2}, \quad \text{and} \quad (3.4)$$

$$r_c = \left|\frac{x_c y_c}{x_c \sin\phi_a + y_c \cos\phi_a}\right|. \quad (3.5)$$

The parameter $r_c$ is simply the radial distance from the origin 14 at which the wedges are truncated on the surfaces 16, 20, $\phi=\pm\phi_a$. The expansion (3.2) is valid for small radial distances r and $|\phi|<\phi_a$.

The harmonic coefficients $a_n$ take a particularly simple form if $$y_c = -x_c \tan(\phi_a+\alpha), \quad (3.6)$$

which corresponds to a truncation parallel to the remanences $J_\pm$ forming wedge pairs 30, 32, as shown in FIG. 2. With this assumption, all the magnetic charge is located on the surfaces 16, 20, $\phi=\pm\phi_a$ and 18, 22, $\phi=\pm\phi_b$. Applying (3.6) to (3.5), one finds $$r_c = \frac{|x_c \sin(\phi_a + \alpha)|}{\sin\alpha}. \quad (3.7)$$

To determine the $a_n$, it is convenient to use the two-dimensional Green's function G defined by $$\phi(r,\phi) = \frac{1}{\mu_0} \int_0^\infty dr' \int_0^{\phi_b} r' G(r,\phi;r',\phi') \rho(r',\phi'), \quad (3.8)$$

where $\rho$ is the magnetic charge density. The charge density is assumed to obey the symmetry $$\rho(r,-\phi) = -\rho(r,\phi). \quad (3.9)$$

The Green's function can be expanded in circular harmonics as $$G(r, \phi; r', \phi') = \sum_{n=1}^{\infty} \frac{1}{\pi n} \left(\frac{r_<}{r_>}\right)^{nv} \sin(nv\phi)\sin(nv\phi'), \quad (3.10)$$

where $r_<$ represents the lesser of r and r', while $r_>$ represents the greater of r and r'.

To find the $a_n$, note that a wedge magnet truncated according to (3.1) can be viewed as a superposition of the ideal infinite wedge magnet and a second wedge magnet truncated by removal of the magnetic material located in the region $$\frac{x}{x_c} + \frac{|y|}{y_c} < 1 \quad (3.11)$$

and having remanences $-J_\pm$ in the upper and lower wedges. Since the ideal wedge magnet generates a perfectly uniform field, the distortion of the potential must be due solely to the second pair of wedges. With the condition (3.6), the charge density, for $\phi>0$, of the second wedge magnet may be expressed $$\rho(r, \phi) = \begin{cases} \frac{J_1}{r} [\sin\alpha\delta(\phi - \phi_a) - \sin(\alpha + \phi_b - \phi_a)\delta(\phi - \phi_b)] & r \geq r_c \\ 0 & r < r_c. \end{cases} \quad (3.12)$$

Applying (3.8) to (3.12) and using the expansion (3.10), one obtains $$a_n = \frac{\sin\alpha}{\pi n(nv - 1)} \sin(nv\phi_a). \quad (3.13)$$

Observe that if $\phi_a/\phi_b$ is a rational number j/k, then the coefficients $a_n$ vanish for n=k,2k,3k, . . . .

It is interesting to compute the intensity H and its derivative along the x axis. Because of the symmetry (3.9), H on the x axis is oriented in the y direction. Using Eq. (3.2), the y component of H and its first derivative are found to be $$H_y|_{y=0} = K\frac{J_1}{\mu_0} - \frac{J_1}{\mu_0} \sum_{n=1}^{\infty} nva_n \left(\frac{x}{r_c}\right)^{nv-1} \text{ and} \quad (3.14)$$

$$\frac{\partial H_y}{\partial x}\bigg|_{y=0} = -\frac{J_1}{\mu_0 r_c} \sum_{n=1}^{\infty} nv(nv - 1)a_n \left(\frac{x}{r_c}\right)^{nv-2}. \quad (3.15)$$

Since $v=\pi/\phi_b>1$, Eq. (3.14) shows that the magnitude of the intensity always approaches the ideal value $KJ_1/\mu_0$ as x→0. However, Eq. (3.15) demonstrates that the derivative of the intensity goes to zero as x→0 only if $\phi_b<\pi/2$. If $\phi_b=\pi/2$, $\partial H_y/\partial x$ goes to a constant, and if $\phi_b>\pi/2$, $\partial H_y/\partial x$ diverges.

IV. Two-Dimensional Compensation

Figure 3:
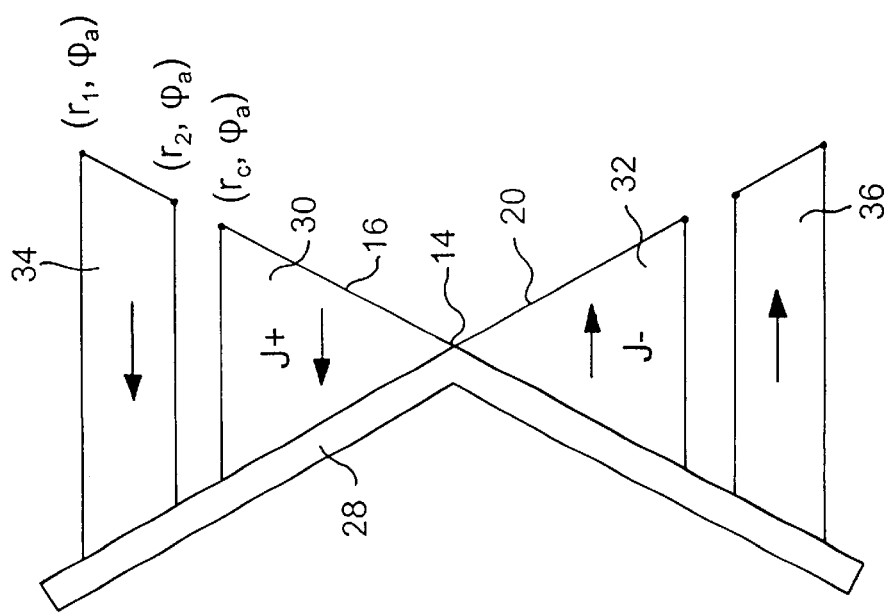
FIG. 3 is a schematic view of another form of magnetic structure with wedge-shaped blocks employing compensation means using spaced compensation blocks in accordance with the invention.

A selected set of harmonics of the expansion (3.2) can be eliminated by adding to a wedge magnet pairs of uniformly magnetized blocks in the region satisfying condition (3.1). In particular, let the j-th pair of compensating blocks fill the region defined by $$\frac{r_{2j}}{r_c} < \frac{x}{x_c} + \frac{|y|}{y_c} < \frac{r_{2j-1}}{r_c}, \quad (4.1)$$

$$\phi_a < |\phi| < \phi_b,$$

with $r_c \leq r_{j+1} < r_j$. The upper ($\phi>0$) block 34 is taken to have the remanence $(J_2/J_1)J_+$, while the lower ($\phi<0$) block 36 is taken to have the remanence $(J_2/J_1)J_-$. A sketch of a wedge magnet structure with one pair of compensating blocks is shown in FIG. 3. The orientation relative to the x y z coordinate system remains the same. $J_2$ herein refers to the magnitude of the remanence J of the compensating blocks 34, 36.

Assuming the condition (3.6), the change in the potential $\phi$ caused by the compensating blocks is easily computed with the help of (3.8). One finds that a set of N harmonics $\{n_I, I=1,2,\ldots,N\}$ can be cancelled by choosing N values of $r_j$ that satisfy the compensation equation $$\frac{J_1}{J_2} = \sum_{j=1}^{N} (-1)^{j+1} \left[1 - \left(\frac{r_c}{r_j}\right)^{vn_I-1}\right], \quad \text{for } I = 1, \ldots, N. \quad (4.2)$$

If N is even, N/2 pairs of compensating blocks are needed, while if N is odd, (N+1)/2 pairs are needed. When N is odd, $r_{N+1}$ is set equal to $r_c$. Note that (4.2) is independent of both $\phi_a$ and $\alpha$. The natural choice for the $n_I$ are the N lowest order, nonvanishing harmonics.

The simplest case of an N=1 compensation with $n_1=1$ has the solution $$\frac{r_1}{r_c} = \left(1 - \frac{J_1}{J_2}\right)^{-1/(v-1)}. \quad (4.3)$$

Figure 4:
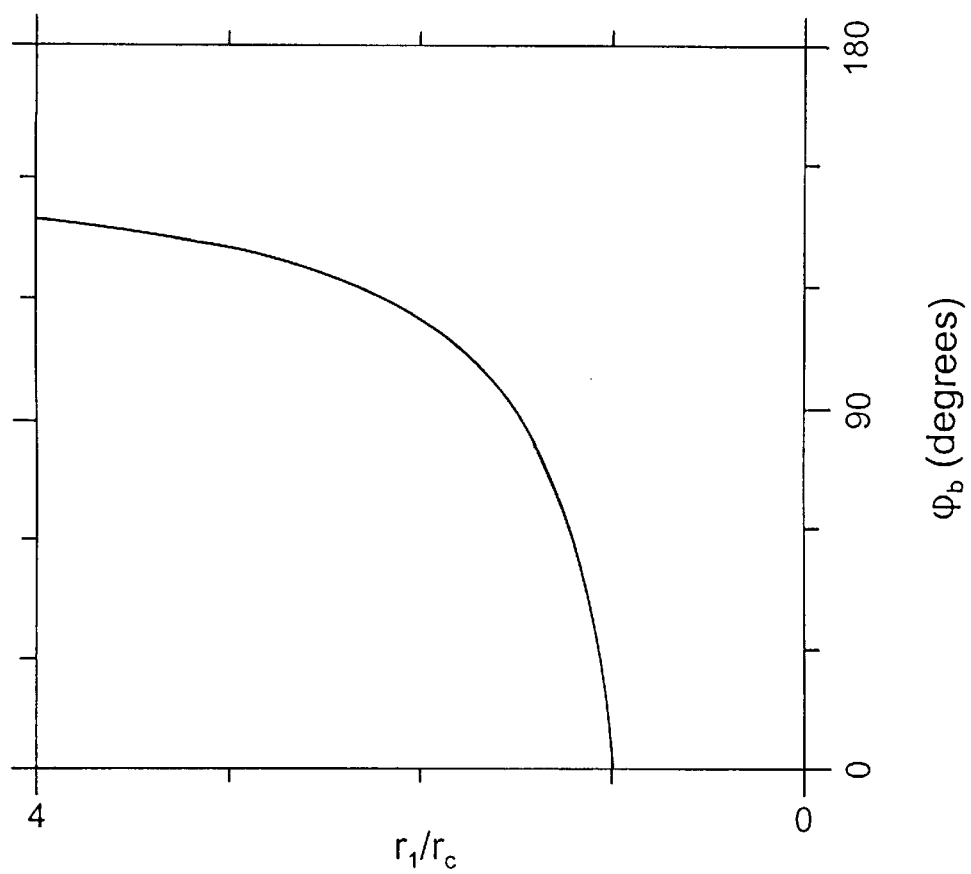
FIG. 4 is a graph plotting parameters of the wedge-shaped blocks of the embodiment of FIG. 11 for a particular ratio of wedge and compensation block remanences.

Clearly, (4.3) requires $J_2>J_1$. A plot of $r_1/r_c$ versus $\phi_b$ for $J_2/J_1=3.0$ is given in FIG. 4, showing that $r_1$ increases rapidly for $\phi_b>90°$. The value $J_2/J_1=3.0$ approximates the ratio of the remanence of the rare earth hard magnet Nd.Fe.B to that of hard ferrite.

Figure 5:
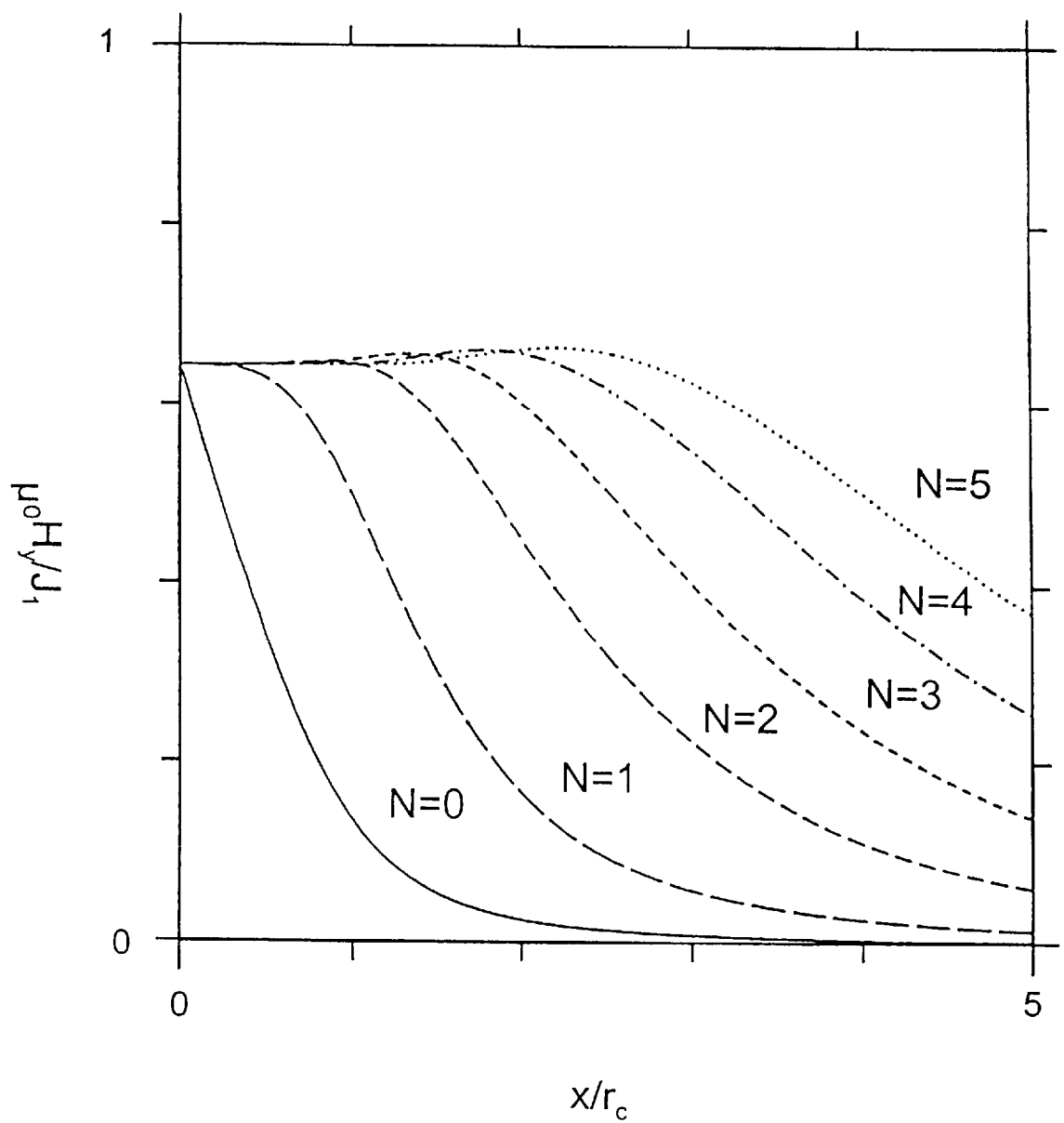
FIG. 5 is a graph illustrating the decrease in field distortion for different numbers of cancelled harmonics for embodiments according to the invention.

The general solution to (4.2) cannot be given analytically, but the equation may be readily solved numerically if N is not too large. Table I below gives the solutions up to N=5, assuming $J_2/J_1=3.0$, $\phi_b=90°$, and $n_I=I$. The corresponding expansion coefficients $a_n$ are given in Table II below for $\phi_a=50°$ and $\alpha=90°$, and plots of $H_y$ on the x axis for the different values of N are shown in FIG. 5.

TABLE I

| j | N = 1 | N = 2 | N = 3 | N = 4 | N = 5 |
|---|-------|-------|-------|-------|-------|
| 1 | 1.500 | 2.484 | 3.367 | 4.351 | 5.267 |
| 2 | 1.000 | 1.359 | 1.762 | 2.236 | 2.682 |
| 3 | —     | —     | 1.067 | 1.251 | 1.445 |
| 4 | —     | —     | 1.000 | 1.092 | 1.224 |
| 5 | —     | —     | —     | —     | 1.026 |
| 6 | —     | —     | —     | —     | 1.000 |

TABLE II

| n | N = 0 | N = 1 | N = 2 | N = 3 | N = 4 | N = 5 |
|---|-------|-------|-------|-------|-------|-------|
| 1 | 0.31347 | 0 | 0 | 0 | 0 | 0 |
| 2 | −0.01815 | 0.02016 | 0 | 0 | 0 | 0 |
| 3 | −0.01838 | 0.02950 | −0.00706 | 0 | 0 | 0 |
| 4 | 0.00731 | −0.01333 | 0.00478 | −0.00110 | 0 | 0 |
| 5 | 0.00455 | −0.00874 | 0.00369 | −0.00156 | 0.00020 | 0 |
| 6 | −0.00418 | 0.00821 | −0.00375 | 0.00223 | −0.00055 | 0.00006 |

For a wedge magnet designed for MRI, a critical parameter is the radius $r_{img}$ of the region with a prescribed field uniformity U. A typical MRI system requires $U \leq 10^{-4}$ for the imaging region. Assuming the field distortion is dominated by the $n = \bar{n}$ harmonic, then (2.2) and (3.2) imply an imaging radius $$r_{img} \approx r_c \left( \frac{KU}{2\sqrt{\bar{n}} a_{\bar{n}}} \right)^{1/(v\bar{n}-1)}. \tag{4.4}$$

For the example of Table II, K=0.643 and v=2.0. After an N=4 compensation, the dominant harmonic is the n=5, and Eq. (4.4) with $\bar{n}$=5 and $U=10^{-4}$ then gives $r_{img} \approx 0.63\, r_c$. That is to say, the region of interest extends from the origin 14 of the xyz coordinate system out to a radius approximately equal to 63% of the radius $r_c$, which is the length of the side 16 measured from the origin.

Figure 6B:
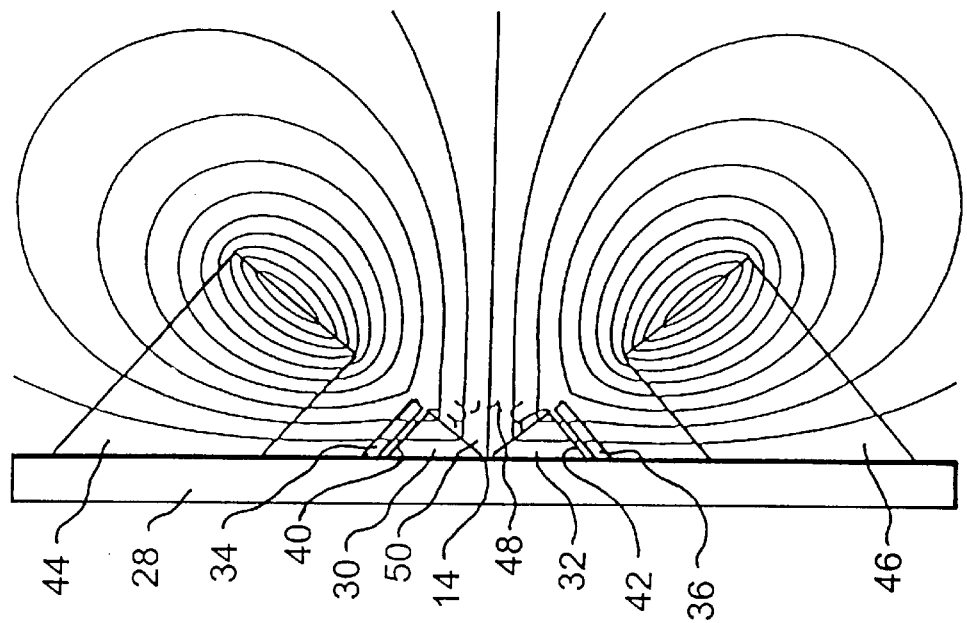
FIG. 6B is a schematic view of still another form of magnetic structure with wedge-shaped blocks employing two pairs of spaced compensation blocks in accordance with the invention.
Figure 6A:
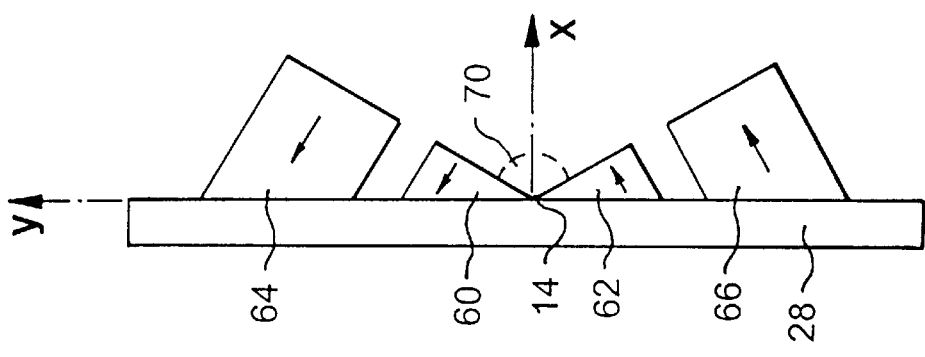
FIG. 6A is a view similar to that of the embodiment of FIG. 3 but for the special case where a block side is parallel to the y axis.

In FIG. 6A, a pair of wedges 60, 62 are provided with their remanences oriented parallel to their respective remote surface, and with a pair of spaced compensation blocks 64, 66 with respective parallel magnetizations. The arrangement is such that a surface of the blocks 60, 62, 64, 66 is positioned in or parallel to the y axis. For this arrangement, for a ratio of $J_2/J_1$=3.0, the first three harmonics of the field distortion are eliminated. The third harmonic is automatically cancelled because $\phi_a/\phi_b = 2/3$. The dashed curve designated 70 denotes the extent of an imaging region in which, for example, an extremity of a patient can be placed for analysis by conventional MRI techniques.

FIG. 6B shows the N=4 structure together with the boundary of the imaging region and the equipotential surfaces. In FIG. 6B, two pairs of compensating blocks 34, 36 and 44, 46 are provided for the wedges 30, 32. The boundary of the imaging region, i.e., the region of interest, is shown by the circular indication 48. As with the FIG. 6A embodiment, an air-gap separates each compensating block from its associated wedge as well as from the adjacent compensating block when eliminating even-numbered harmonics. To eliminate odd-numbered harmonics, there should be no air-gap.

Figure 7:
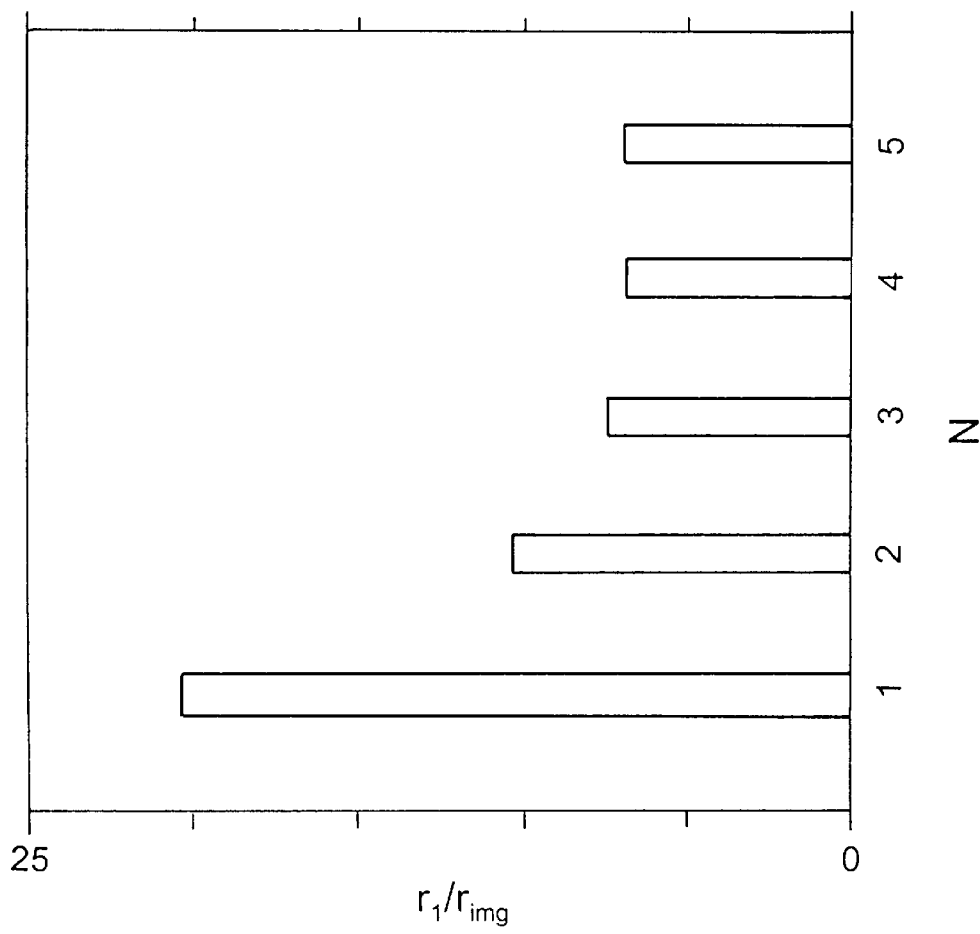
FIG. 7 is a graph illustrating the decrease in the ratio of the radial extent of the compensation blocks to that of the imaging region for different numbers of cancelled harmonics for embodiments according to the invention.

In order to estimate the size of a magnet needed to produce an imaging region of a given radius, it is useful to compute the ratio $r_1/r_{img}$. This is plotted in FIG. 7 as a function of N. The most compact structure is that with N=4 for which $r_1/r_{img}$=6.9. Significantly more compact structures are possible for special values of $\phi_a$ and $\phi_b$. For example, if $\phi_a$=60° and $\phi_b$=90°, then every third harmonic vanishes automatically as follows from Eq. (3.13). Since this vanishing is not spoiled by the addition of compensating blocks, the $n_I$ need not include any multiples of 3. Thus, for an N=4 compensation, one may choose $n_1$=1, $n_2$=2, $n_3$=4, and $n_4$=5. With $J_2/J_1$=3.0, the solution to (4.2) is then $r_1$=3.768 $r_c$, $r_2$=1.988 $r_c$, $r_3$=1.195 $r_c$, and $r_4$=1.073 $r_c$. As the n=6 harmonic vanishes automatically, the dominant remaining harmonic is the n=7, which has $a_7$=0.00027 for $\alpha$=90°. Using (4.4) with $\bar{n}$=7 and $U=10^{-4}$, one finds $r_1/r_{img}$=5.5.

Figure 8:
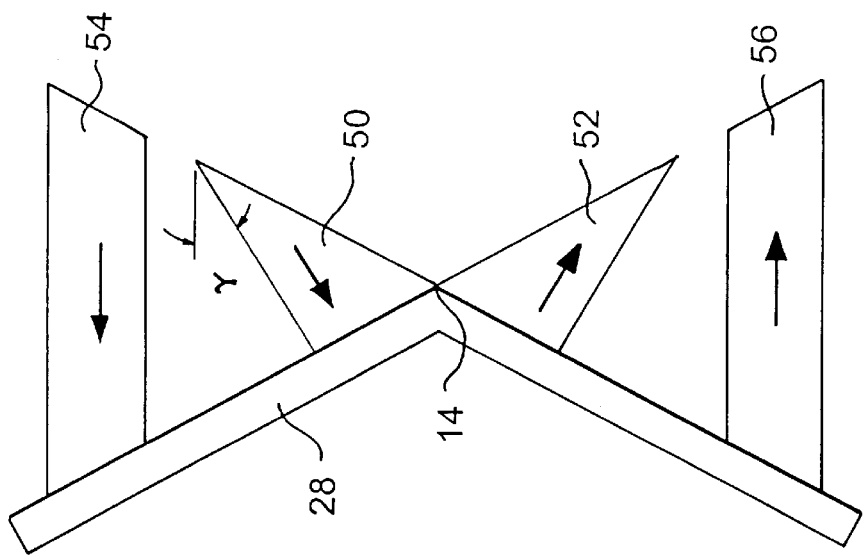
FIG. 8 is a schematic view of still another form of magnetic structure with wedge-shaped blocks employing spaced compensation blocks in accordance with the invention but with the orientation of the magnetization of the wedge-shaped blocks rotated.

In the above examples, $J_2$ in the compensating blocks is assumed to exceed $J_1$ in the wedges. This need not be the case if the orientations of the remanences in the central wedges 50, 52 are rotated by an angle $\gamma$, while those of the compensating blocks 54, 56 are left unchanged, as sketched in FIG. 8. The compensation equation is then transformed to $$\frac{J_1'}{J_2} = \sum_{j=1}^{N} (-1)^{j+1} \left[ 1 - \left( \frac{r_c}{r_j} \right)^{vn_I - 1} \right], \quad \text{for } I = 1, \ldots, N, \tag{4.5}$$

where $J_1'$ is an effective remanence magnitude given by $$J_1' = J_1 \frac{\sin(\alpha + \gamma)}{\sin \alpha}. \tag{4.6}$$

Equation (4.5) can have solutions with $J_1=J_2$, as long as $J_1' < J_1$. As an illustration, when $\alpha$=90° and $\gamma$=60°. Then $J_1'=J_1/2$, and the N=2 solution to (4.5) with $\phi_b$=90° and $n_I$=I is $r_1$=3.236 $r_c$ and $r_2$=1.236 $r_c$. However, the price paid for having $J_1=J_2$ is a reduction of the uniform component of the field by a factor $J_1'/J_1$.

Three-Dimensional Truncation and Compensation

The two-dimensional wedge structures considered in the previous section, which can only be implemented, approximately, as a real structure, must also be truncated in the z direction. If the z length is long compared to 2 $r_1$, then the distortion caused by this truncation is small and may be corrected by any of a number of conventional shimming techniques. Alternatively, a truncation in the z direction with a length equal to 2 $r_1$ can be achieved by using a three-dimensional version of the compensating block technique.

Define a system of spherical coordinates (r, $\theta$, $\phi$) by $x = r \sin\theta \cos\phi$, $y = r \sin\theta \sin\phi$, $z = r \cos\theta$. (5.1)

Throughout this section, the symbol r refers to the distance from the origin, $(x^2+y^2+z^2)^{1/2}$, rather than the distance from the z axis as in Secs. III and IV. Assuming that the charge density obeys the symmetries $\rho(r, -\theta, \phi) = \rho(r, \theta, \phi)$ $\rho(r, \theta, -\phi) = -\rho(r, \theta, \phi)$, (5.2)

the magnetostatic potential produced by $\rho$ is given by $$\phi(r, \theta, \phi) = \frac{1}{\mu_0} \int_0^\infty dr' \int_0^{\pi/2} d\theta' \int_0^{\phi_b} d\phi' (r')^2 \tag{5.3}$$
$$\sin\theta'\, G(r, \theta, \phi; r', \theta', \phi') \rho(r', \theta', \phi'),$$

where

G is now the three-dimensional Green's function. The harmonic expansion for G is $$G(r, \theta, \phi; r', \theta', \phi') = \sum_{m=0}^{\infty} \sum_{n=1}^{\infty} c_{mn} \frac{r_<^{nv+2m}}{r_>^{nv+2m+1}} \sin(nv\phi) \quad (5.4)$$
$$\sin(nv\phi') P_{nv+2m}^{-nv}(\cos\theta) P_{nv+2m}^{-nv}(\cos\theta'),$$

where $P_\alpha^\beta$ are the associated Legendre functions and $$c_{mn} = \frac{2v\Gamma(2nv + 2m + 1)}{\pi(2m)!}. \quad (5.5)$$

If the wedges are truncated at a radial distance, $$R(\theta,\phi)=r_c \sin\alpha \,[\cos^2\theta \sin^2\alpha+\sin^2\theta \sin^2(\alpha+\phi_a-|\phi|)]^{-\frac{1}{2}}, \quad (5.6)$$

then magnetic charge is located only on the surfaces $\phi=\pm\phi_a$ and $\phi=\pm\phi_b$. Using Eqs. (5.3)–(5.5), one then finds for $r<r_c$ and $|\phi|<\phi_a$ $$\phi(r, \theta, \phi) = \phi_0 + \frac{J_1 r_c}{\mu_0} \sum_{m=0}^{\infty} \sum_{n=1}^{\infty} a_{mn}\left(\frac{r}{r_c}\right)^{nv+2m} \quad (5.7)$$
$$\sin(nv\phi) P_{nv+2m}^{-nv}(\cos\theta),$$

where $$a_{mn} = \frac{v 2^{nv}\Gamma(m+nv+1/2)\Gamma(m+nv/2+1/2)}{\pi(nv+2m-1)m!\Gamma(m+nv/2+1)} \sin\alpha \sin(nv\phi_a). \quad (5.8)$$

Let the jth pair of compensating blocks be restricted to the region defined by $$\frac{r_{2j}}{r_c} R(\theta, \phi) < r < \frac{r_{2j-1}}{r_c} R(\theta, \phi), \quad (5.9)$$
$$\phi_a < \phi < \phi_b,$$

in analogy with (4.1). With the aid of Eq. (5.3), the compensation equation can then be shown to be $$\frac{J_2}{J_1} = \sum_{j=1}^{N} (-1)^{j+1}\left[1 - \left(\frac{r_c}{r_j}\right)^{\lambda_l-1}\right], \quad \text{for } l = 1, \ldots, N. \quad (5.10)$$

In (5.10), $\lambda_l$ represents the distinct values of $nv+2m$ corresponding to harmonics $(n,m)$ that are to be cancelled. If $v$ is a rotational number, then different harmonics may have the same value of $nv+2m$, and the number of cancelled harmonics may exceed N. Most notably, when $v=2$, corresponding to $\phi_b=90°$, an N order compensation can eliminate the $N(N+1)/2$ harmonics with the smallest radial exponents, implying that a particularly efficient compensation is possible in this case.

Figure 9B:
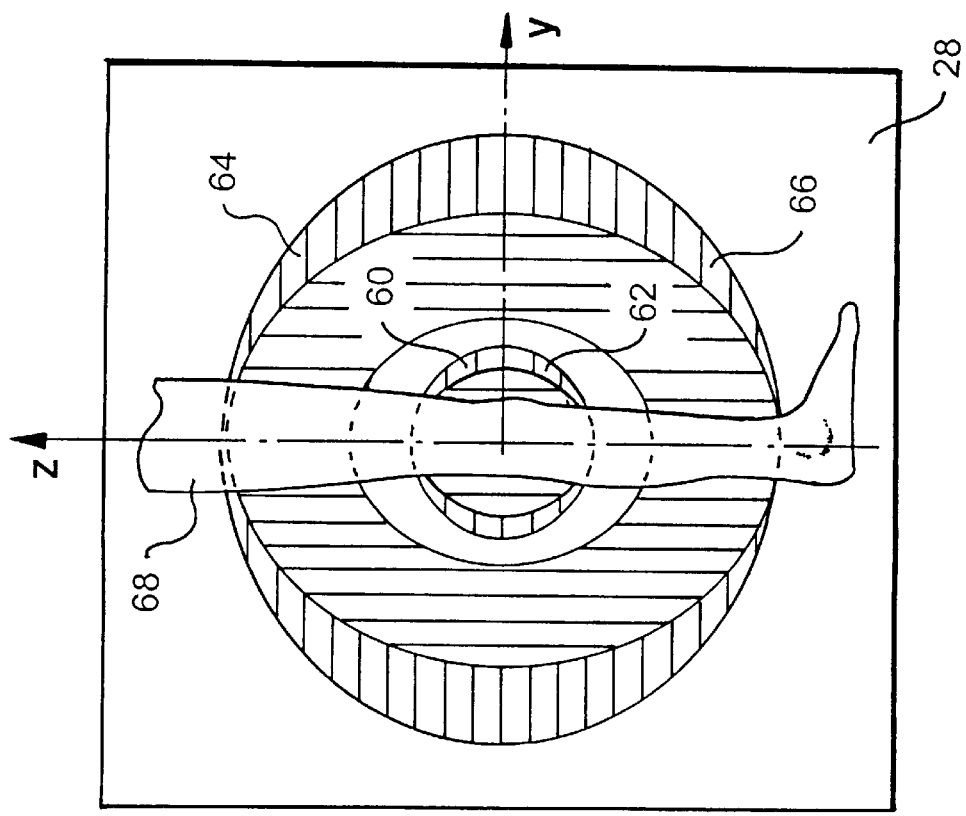
FIG. 9B is a view along the x axis of another structure showing 3D compensation and how it can be used for MRI.
Figure 9A:
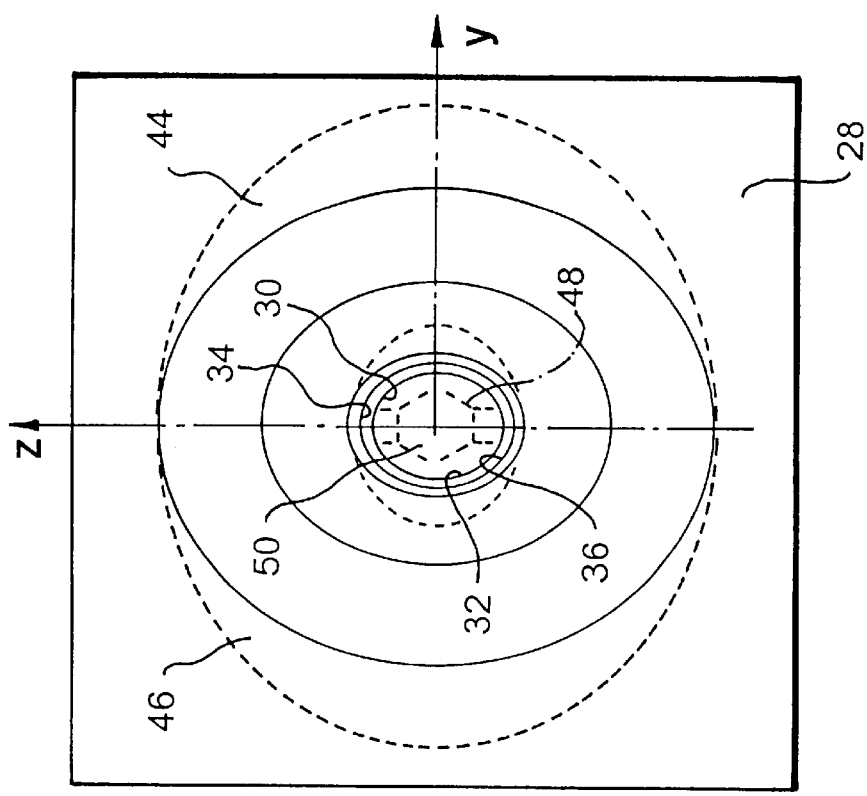
FIG. 9A is a view along the x axis of a structure with three-dimensional (3D) compensation in accordance with the invention.

A sketch of structures with three-dimensional compensating blocks is given in FIGS. 9A and 9B, in which the ferromagnetic plates are parallel to the y axis. In FIG. 9A, which is a top view looking down at the structure along the x-axis, each wedge 30, 32, in 3-D, appears as an orange slice forming the common edge 14 (the z axis in FIG. 6A), and each compensating block of the two pairs of compensating blocks 34, 36, 44, 46 similarly appears as an orange slice spaced by air gaps from the associated wedge. A cross-section of the 3D structure shown in FIG. 9A taken along the plane z=0 would appear somewhat similar to the view of FIG. 6B also with two pairs of compensation blocks.

In FIG. 9B, a pair of wedges 60, 62 are provided with their remanences oriented parallel to their respective remote surface, and with a pair of spaced compensation blocks 64, 66 with respective parallel magnetizations. An extremity 68 of a patient, such as a leg, is shown positioned in the imaging region suitable for analysis by conventional MRI techniques. The imaging region would be a spherical region similar to that shown in FIG. 6A at 70. As with FIG. 9A, in FIG. 9B, which is a top view looking down at the structure along the x-axis, each wedge 60, 62, in 3-D, appears as an orange slice forming the common edge 14 (the z axis), and each compensating block 64, 66 similarly appears as an orange slice spaced by air gaps from the associated wedge.

The solutions to the three-dimensional compensation equation (5.10) are similar to those of the two-dimensional equation (4.2). In fact, $r_1$ for an N=1 compensation are identical for the two cases, and for the special values $\phi_b=\pi/2$ k, k=1,2, ..., the $r_j$ are the same for any N. Table I, therefore, also supplies solutions to Eq. (5.10). When the two- and three-dimensional solutions for $r_j$ coincide, then the imaging radii $r_{img}$ for the two cases are generally about the as well. However, the special case of $\phi_a=60°$ and $\phi_b=90°$, which leads to an especially compact two-dimensional structure due to the automatic vanishing of the n=3 and n=6 harmonics, has a significantly smaller three-dimensional imaging radius. This is because the m≠0 harmonics with n+m=3 and n+m=6 do not vanish automatically, forcing the compensation to be performed in the generic fashion.

An important consequence of having a fully three-dimensional compensation is the ability to estimate the mass of magnetic material required to obtain an imaging region of a given size. For example, using the N=4 solution of Table I with $\phi_a=60°$ and $\alpha=120°$, one finds that an imaging region with a radial extent of 8 cm can be produced with a magnet consisting of about 6 kg of ferrite and about 630 kg of Nd.Fe.B. Since in this case K=0.433, the field strength would be about 0.17 T, assuming the ferrite has a remanence of magnitude 0.40 T.

VI. Figure of Merit

For applications requiring magnets of large size, optimizing the efficiency of the magnet becomes critical in minimizing the magnet's cost and weight. A useful definition of a magnet's efficiency is the figure merit defined by $$M = \frac{\int |B|^2 dV}{\int |J_0|^2 dV}, \quad (6.1)$$

where the integral in the numerator is taken over a region of interest and the integral in the denominator is taken over the entire magnetic structure. Now consider a wedge magnet compensated according to the generic two-dimensional method described in Sec. IV. If the region of interest is chosen to be the area defined by $|\phi|<\phi_a$ and $r<r_{img}$ (i.e., the imaging region), then within the region B≈K $J_1$ ŷ, and the figure of merit can be written $$M = K^2 J_1^2 A_{img} \left( J_1^2 A_w + J_2^2 \sum_{j=1}^{N_b} A_j \right)^{-1}, \quad (6.2)$$

where $A_{img}$ is the area of the imaging region, $A_w$ is the cross-sectional area of the central pair of wedges, $A_j$ is the cross-sectional area of the jth pair of compensating blocks, and $N_b$ is the total number of pairs of compensating blocks. In terms of the angles $\phi_a$, $\phi_b$, and $\alpha$, the areas $A_{img}$, $A_w$, and $A_j$ are $$A_{img} = r_{img}^2 \phi_a, \quad (6.3)$$

$$A_w = r_c^2 \frac{\sin\alpha \sin(\phi_b - \phi_a)}{\sin(\alpha - \phi_b + \phi_a)},$$

$$A_j = (r_{2j-1}^2 - r_{2j}^2) \frac{\sin\alpha \sin(\phi_b - \phi_a)}{\sin(\alpha - \phi_b + \phi_a)}.$$

Using Eqs. (2.3), (6.2), and (6.3), one can show $$M = \frac{C\phi_a}{\sin^2\phi_b} \sin\alpha \sin(\phi_b - \phi_a) \sin(\alpha - \phi_b + \phi_a), \quad (6.4)$$

where $$C = r_{img}^2 \left[ r_c^2 + \frac{J_2^2}{J_1^2} \sum_{j=1}^{N_b} (r_{2j-1}^2 - r_{2j})^2 \right]^{-1}. \quad (6.5)$$

Equation (6.4) also holds for a magnet compensated with the three-dimensional approach of Sec. V, if C is replaced by C' given by $$C' = r_{img}^3 \left[ r_c^3 + \frac{J_2^2}{J_1^2} \sum_{j=1}^{N_b} (r_{2j-1}^3 - r_{2j})^3 \right]^{-1}. \quad (6.6)$$

Figure 10:
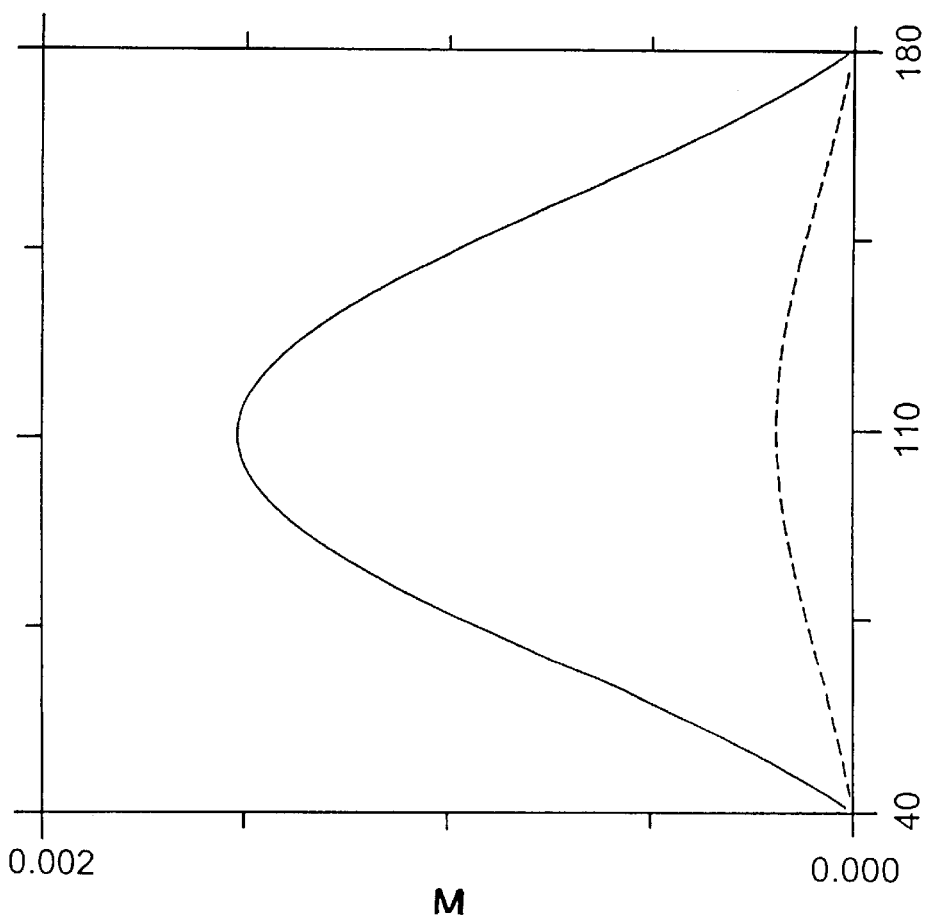
FIG. 10 is a graph plotting figures of merit for different geometries of the wedge-shaped blocks.

Fixing $\phi_a$ and $\phi_b$, let us maximize M by varying $\alpha$. Since $r_{img}$ and the $r_j$ are independent of $\alpha$, maximizing M is equivalent to maximizing $\sin\alpha \sin(\alpha - \phi_b + \phi_a)$. A straightforward calculation then yields $$\alpha = \frac{1}{2}(\phi_b - \phi_a + \pi), \quad (6.7)$$

as the condition for maximum efficiency. FIG. 10 shows as a function of $\alpha$ the two- and three-dimensional figures of merit for an N=4 compensation with $\phi_a=50°$, $\phi_b=90°$, $J_2/J_1=3.0$, and $U=10^{-4}$.

VII. Nonideal Magnetic Permeability

The above has assumed the ideal relation (1.1) between the intensity, flux, and remanence. A real magnetic material more accurately obeys the relation $$B = \mu H + J_0, \quad (7.1)$$

where $\mu > \mu_0$ is the magnetic permeability [1–3]. Typically, $\mu/\mu_0$ is in the range of 1.05 to 1.10.

For an ideal wedge magnet of infinite extent, the effect of $\mu$ being different from $\mu_0$ is easily obtained. In particular, Eq. (2.2) still holds, but the expression (2.3) for K is generalized to $$K = \frac{\sin\alpha \cos(\phi_a + \delta) \sin(\phi_b - \phi_a)}{\cos\phi_a \sin(\phi_b + \delta)}, \quad (7.2)$$

where $\delta$ is defined by $$\mu_0 \tan(\phi_a + \delta) = \mu \tan\phi_a, \quad (7.3)$$

$$\frac{-\pi}{2} < \delta < \frac{\pi}{2}.$$

Similarly, Eq. (2.4) holds with K' generalized to $$K' = \frac{\sin\alpha \cos(\phi_a + \delta) \sin\phi_a}{\cos\phi_a \sin(\phi_b + \delta)}. \quad (7.4)$$

For a truncated wedge magnet, the compensation procedure should be modified in two respects. First, in the compensation equations (4.2) and (5.10), $J_1$ should be replaced by an effective remanence magnitude $$\tilde{J}_1 = J_1 \frac{\cos(\phi_a + \delta) \sin\phi_b}{\cos\phi_a \sin(\phi_b + \delta)}, \quad (7.5)$$

and second, the angles at which the central wedges are truncated should be parallel to the magnetic polarization density $$J = J_0 + (\mu - \mu_0)H, \quad (7.6)$$

rather than parallel to the remanence $J_0$. With these alterations, the field distortion due to the nonideal permeability in the central wedges is almost entirely corrected. The remaining field distortion due to the nonideal permeability of the compensating blocks can either be corrected with the help of standard numerical techniques or be left to the shimming of the magnet.

VIII. Additional Embodiments

With respect to the wedge-shaped blocks described and illustrated herein, as for example in FIG. 2, the two surfaces 16 and 20 that subtend the angle ($\phi_b - \phi_a$) are referred to herein as the block's side surfaces, and the truncated surfaces 6, 8 are referred to as the block's remote surface. In the preferred embodiments, the orientation of the block's remanence will be parallel to its remote surface. While this is not essential to the invention, it is the preferred way to implement embodiments of the invention. Except where not explicitly shown otherwise, it will be understood from the context that the magnetic structures shown are orientated with respect to an xyz coordinate system in which the x axis is horizontal, the y axis vertical, and the z axis is perpendicular to the plane of the drawing.

Figure 11:
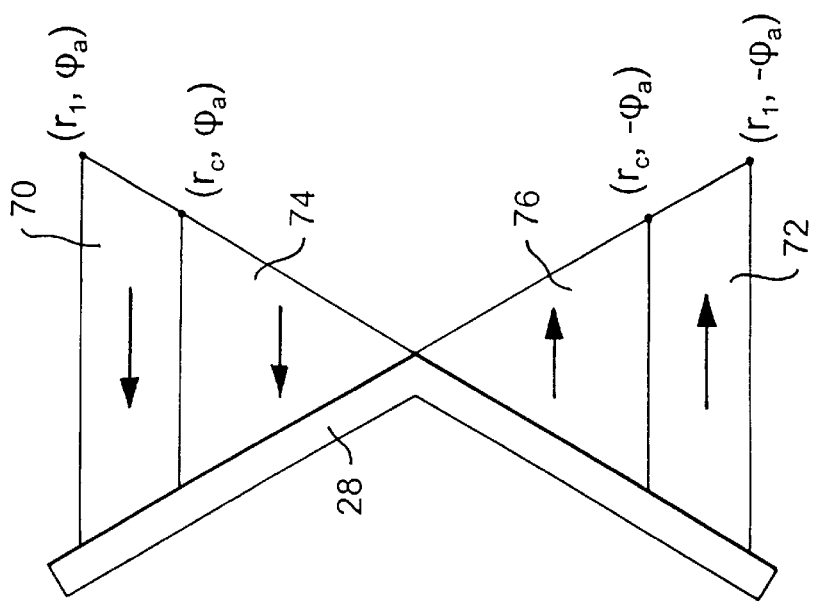
FIG. 11 is a schematic view of another form of magnetic structure with wedge-shaped blocks employing compensation means using abutting compensation blocks in accordance with the invention.

In some of the previous embodiments, the compensation blocks were spaced by air gaps from the wedge-shaped blocks, with the result that both the first and second harmonics of the distortion were compensated. For compensation of odd-numbered harmonics, the air-gaps are not essential. To achieve only first order harmonic compensation, a simpler structure is possible, in which compensation blocks abut the remote surfaces of the respective wedge-shaped blocks. One such embodiment is illustrated in FIG. 11. In this embodiment, the remanence of the compensation blocks 70, 72 must exceed that of the wedge-shaped blocks 74, 76. The higher the ratio of remanences $J_2/J_1$, where $J_2$ is the remanence of a compensation block and $J_1$ is the remanence of a wedge-shaped block, the more compact the structure. A preferred ratio of remanences for a practical embodiment is $J_2/J_1=3.0$. This ratio is preferred because it approximates the ratio of the magnitude of remanence of Nd.Fe.B to that of hard ferrite magnetic material.

Figure 13:
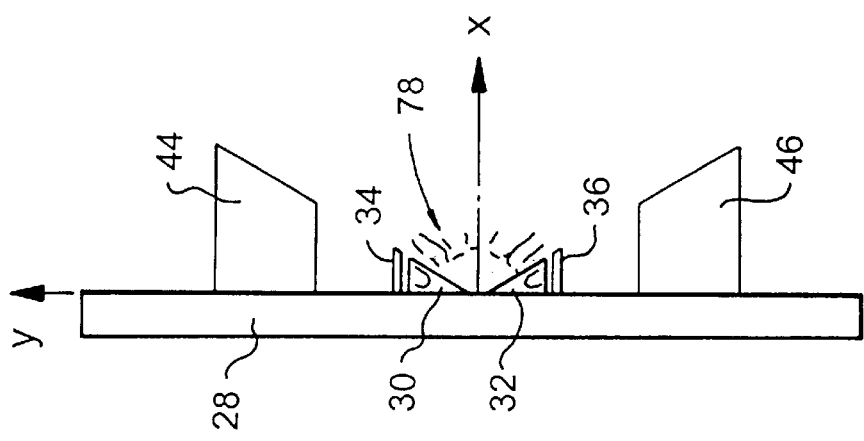
Figure 12:
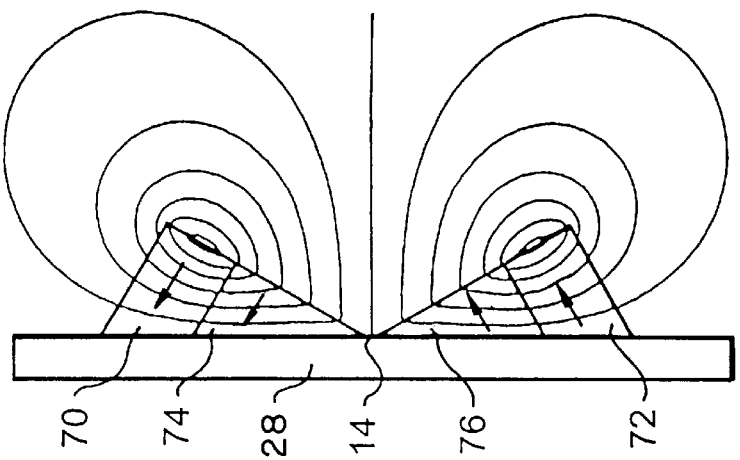
FIG. 12 is a view of the embodiment of FIG. 11 but for the special case where a block side is parallel to the y axis and also showing equipotential field lines of the magnetic structure.

An important special case are the embodiments of FIGS. 12 and 13, provided with coplanar ferromagnetic plates 28 and where $\phi_b=90°$. For this special case, FIG. 12 shows a scale drawing with the equipotential lines where $\phi_a=60°$, and $\alpha=90°$.

FIG. 13 also illustrates in an embodiment similar to that of FIG. 6A but with the remanence orientations (not shown) in all the blocks rotated to extend perpendicular to the high-permeability member 28 and parallel to the xz plane (as before, also parallel to their remote surfaces). With this configuration, the amount of magnetic material required is reduced by 26% with respect to the same structure containing an angle $\alpha=90°$ while the field level is also decreased but only by 13%. The boundary of the imaging region is designated 78.

Figure 14:
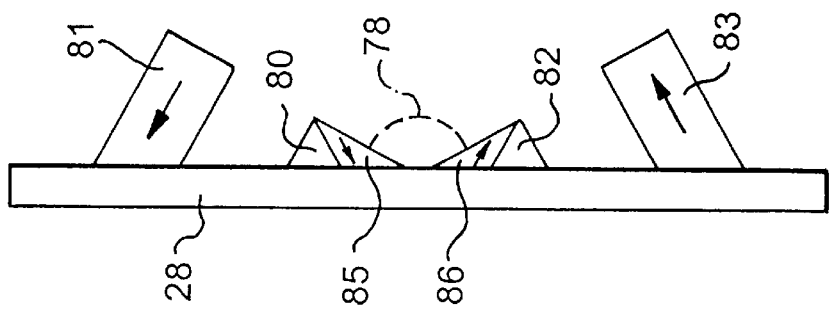
FIGS. 13–16 are schematic views of other forms of magnetic structures with wedge-shaped blocks employing compensation blocks in accordance with the invention.

FIG. 14 illustrates another variant in which a rotation transformation is used to reduce the size of the compensation blocks 80–83 for an example where the magnetic structure remanence ratio is $J_2/J_1=3.0$. The wedges are designated 85, 86. In this case, the first four harmonics are eliminated, but the field level in the region of interest indicated by the dashed lines 78 is reduced by about 50%.

Figure 15:
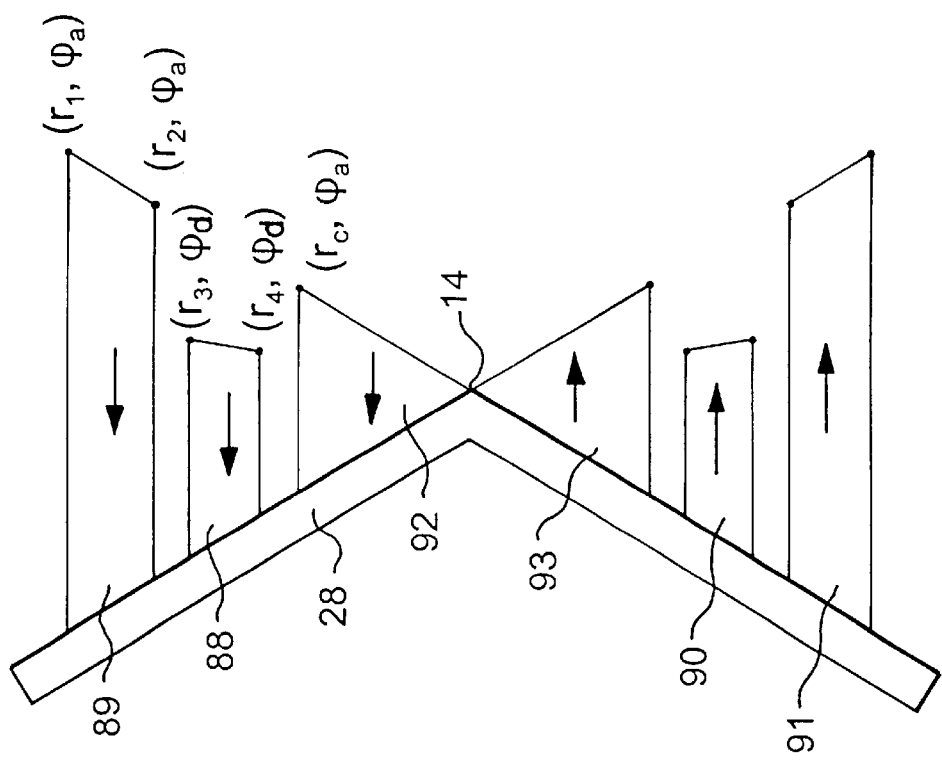

FIG. 15 is still another variant employing multiple pairs of compensation blocks 88–91 for the wedges 92, 93, in which the angular extent for one pair of the compensation blocks 88, 90 can be altered to optimize the magnetic structure. This optimizing scheme is based on the recognition that the harmonics generated by a magnetic charge can depend sensitively on its angular coordinate. By adjusting the angle that the blocks subtend by their side surfaces, as illustrated in FIG. 15, the strength of the block's coupling to the different harmonics can be varied, leading to a more efficient structure. In FIG. 15, following FIG. 3, $r_c$ is the end point of the wedge, $r_1$ and $r_2$ the remote and proximal points of one of the compensating blocks 89, and $r_3$ and $r_4$ the remote and proximal points of another of the compensating blocks 88.

Figure 16:
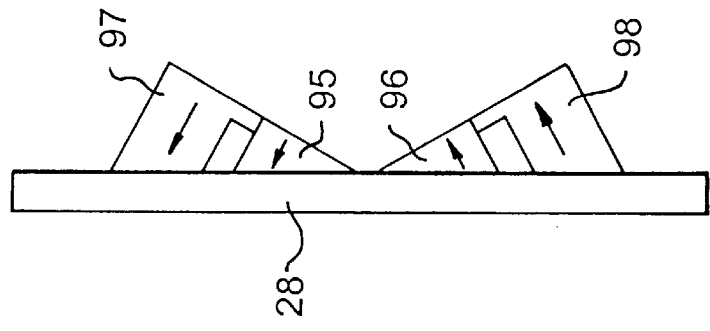

Another optimizing scheme is illustrated in FIG. 16 with wedges 95, 96 and compensation blocks 97, 98, where modified air gaps can be chosen so as to cancel the first two harmonics.

Figure 18:
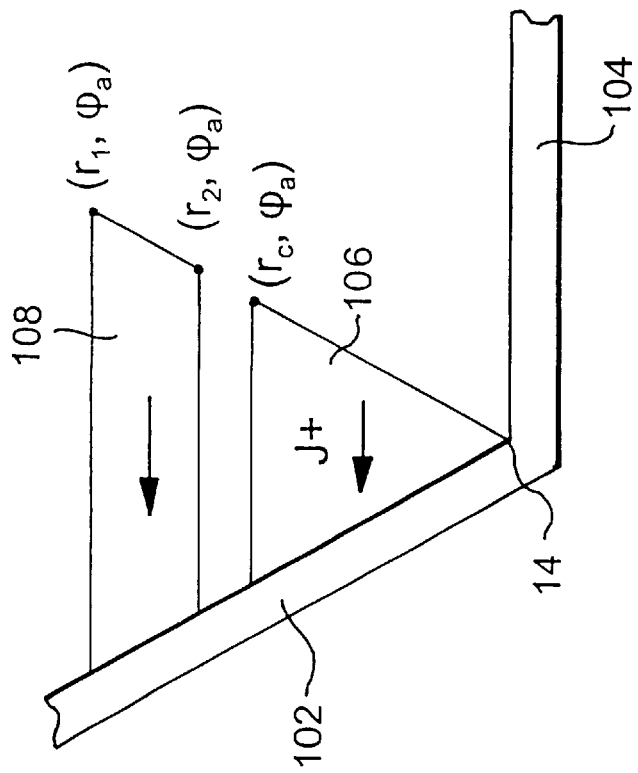
FIG. 18 is a schematic view of one-half of the embodiment of FIG. 3 in a mirror system in accordance with the invention.
Figure 17:
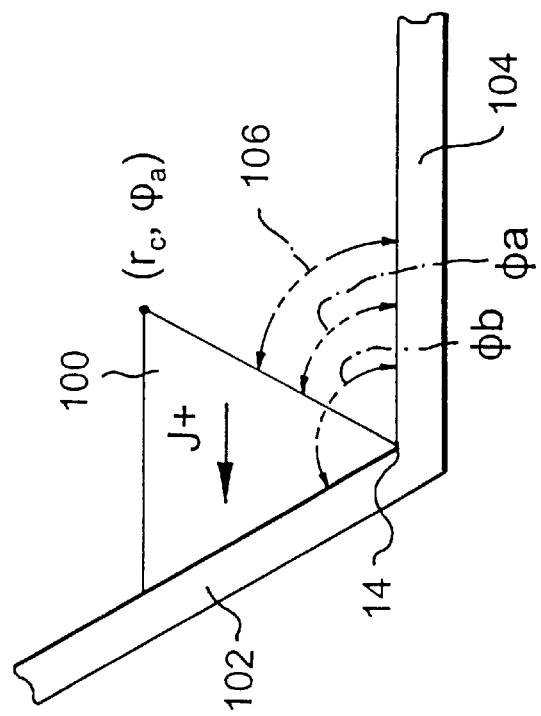
FIG. 17 is a schematic view of one-half of the embodiment of FIG. 2 in a mirror system in accordance with the invention.

As is described in the referenced patent U.S. Pat. No. 5,278,534, where a closed cavity system is involved, the bottom half of a symmetrical magnetic structure can be replaced with a high-permeability member preferably in the form of a flat plate. This high-permeability member functions as a high-permeability mirror for the magnetic field. FIG. 17 illustrates one embodiment of the mirror concept applied to the present invention, with one wedge-shaped block 100 contacted on its second side by a high permeability soft ferromagnetic plate 102 extended 104 along the xz plane to form the high-permeability mirror member. Due to the mirror, the imaging region is approximately one-quarter of a spheroid having a center at the origin 14 of the coordinate system. The imaging region is indicated by the dashed lines 106. The result is that one-half of the magnetic material is eliminated, though the size of the region of interest is also reduced by a factor of two. This configuration may be suitable for certain imaging operations. FIG. 18 also depicts a mirror system with one wedge-shaped block 106 and also provided with one compensating block 108 as described with respect to FIG. 3. The compensation block 108 would function in the mirror system the same as explained above in connection with FIG. 3. It will be apparent that the other magnetic structures described herein, as well as those described and illustrated in the referenced copending application, can also be constructed as a mirror system by replacing the bottom half with a high-permeability member.

IX. Concluding Remarks

The foregoing has described apparatus and a novel method of generating uniform magnetic fields by means of magnetized wedges. A principal advantage of this approach is that the region of high field uniformity is accessible over a large solid angle. An application where this may be important is the integration of medical MRI imaging with procedures needing direct contact with a patient. Following the invention, practical structures may be designed, using ferrite and Nd.Fe.B as magnetic materials, with a field strength of over 0.2 T and an opening of close to $2\pi$ steradians. FIG. 9B shows one such application providing an open magnetic structure for MRI use, with the wedges and compensating blocks corresponding to the FIG. 3 embodiment. The imaging region, using the example above of a size of 8 cm, contains the leg of a patient for diagnostic treatment. The open structure with its limited size imaging region is best suited for examining the extremities of patients or, for example, the spine or shoulder of a patient. For an imaging radius of 10 cm, the radial extent of the magnet can be as small as 70 cm.

The method of the invention is based entirely on an analytic approach, requiring only the minimal numerical effort needed to solve the compensation equation (4.2) or (5.10). The shimming of a magnet would only have to correct for the material and construction tolerances, the deviation of the magnetic permeability from the vacuum value of $\mu_0$, and for the two-dimensional version of the method, the truncation in the z direction.

It will be appreciated that the method and apparatus of the invention described herein is not limited to MRI systems, though that environment provides a particularly good example to illustrate the unusual flexibility and other benefits available with the construction of the invention. Also, while orientations and magnitudes have been described in certain cases as equal or the same, or an equal sign used, it will be readily appreciated by those skilled in this art that identity, while often giving the best results, is not essential and there can be reasonable deviations from equality while still remaining within the teachings of this invention. For example, where angles of sides and magnetizations have been specified as equal, deviations in an amount up to about 3° can be tolerated without departing from the principles set forth herein.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A magnetic structure for generating a uniform magnetic field within a region of interest, comprising:
   a) a pair of wedge-shaped blocks of permanent magnet material and of substantially identical shape and positioned within an arbitrary three-dimensional rectangular coordinate system consisting of perpendicular x, y, and z axes meeting at an origin such that the pair of wedge-shaped blocks are arranged symmetrically on either side of the xz plane and abut one another along a common edge extending along or parallel to the z axis, each wedge-shaped block having a first major side and a second major side subtending a first angle and which terminate at or near the common edge, each wedge-shaped block being substantially uniformly magnetized in a direction substantially perpendicularly to the z axis and a first wedge-shaped block of the pair having a magnetization J whose orientation forms a second angle α with respect to its first side and a second wedge-shaped block of the pair having a substantially similar magnitude of magnetization J,
   b) the first wedge-shaped block of the pair of wedge-shaped blocks being configured to define a third angle $\phi_a$ between the first side and the x axis and a fourth angle $\phi_b$ between the second side and the x axis,
   c) a high-permeability member having an edge substantially coinciding with the z axis and having a face substantially coinciding with the second side of each of the wedge-shaped blocks, the radial extent from the origin of the rectangular coordinate system of the high-permeability member being at least equal to that of the wedge-shaped blocks,
   d) the second wedge-shaped block of the pair of wedge-shaped blocks being magnetized such that components of its magnetization J along the x and y axes are related to corresponding x and y axis components of the magnetization J in the first wedge-shaped block of the pair of wedge-shaped blocks such that one of their respective x and y axis components extends in opposite directions and the other of their respective x and y axis components extend in the same direction,
   e) said region of interest being situated close to the common edge and being confined to a region of the cavity bounded by the first major sides of the wedge-shaped blocks, said wedge-shaped blocks being a major contributor to the uniform magnetic field in the region of interest,
   f) compensation means for reducing field distortions by the substantial elimination of selected harmonics of the uniform magnetic field in the region of interest, the compensation means comprising one or more pairs of compensating blocks of permanently magnetized material and uniformly magnetized perpendicularly to the z axis, the radial extent from the z axis of the compensation blocks exceeding that of the wedge-shaped blocks.

2. A magnetic structure for generating a uniform magnetic field within a region of interest as claimed in claim 1, wherein the orientation of the magnetization J of the first wedge-shaped block is determined by the third angle.

3. A magnetic structure for generating a uniform magnetic field within a region of interest, comprising:
   a) a pair of wedge-shaped blocks of permanent magnet material and of substantially identical shape and positioned within an arbitrary three-dimensional rectangular coordinate system consisting of perpendicular x, y, and z axes meeting at an origin such that the pair of wedge-shaped blocks are arranged symmetrically on either side of the xz plane and abut one another along a common edge extending along or parallel to the z axis, each wedge-shaped block having a first major side and a second major side subtending a first angle and which terminate at or near the common edge, each wedge-shaped block being substantially uniformly magnetized in a direction substantially perpendicularly to the z axis and a first wedge-shaped block of the pair having a magnetization J whose orientation forms a second angle α with respect to its first side and a second wedge-shaped block of the pair having a substantially similar magnitude of magnetization J,
   b) the first wedge-shaped block of the pair of wedge-shaped blocks being configured to define a third angle $\phi_a$ between the first side and the x axis and a fourth angle $\phi_b$ between the second side and the x axis,
   c) a high-permeability member having an edge substantially coinciding with the z axis and having a face substantially coinciding with the second side of each of the wedge-shaped blocks, the radial extent from the origin of the rectangular coordinate system of the high-permeability member being at least equal to that of the wedge-shaped blocks,
   d) the second wedge-shaped block of the pair of wedge-shaped blocks being magnetized such that components of its magnetization J along the x and y axes are related to corresponding x and y axis components of the magnetization J in the first wedge-shaped block of the pair of wedge-shaped blocks such that one of their respective x and y axis components extends in opposite directions and the other of their respective x and y axis components extends in the same direction,
   e) said region of interest being situated in the vicinity of the z axis, said wedge-shaped blocks being a major contributor to the uniform magnetic field in the region of interest,
   f) compensation means for reducing field distortions by the substantial elimination of selected harmonics of the uniform magnetic field in the region of interest, the compensation means comprising one or more pairs of compensating blocks of permanently magnetized material and uniformly magnetized perpendicularly to the z axis, the radial extent from the z axis of the compensation blocks exceeding that of the wedge-shaped blocks and being equal to or less than the radial extent of the high-permeability member, and the compensation blocks at least partially abutting the high permeability member.

4. A magnetic structure generating a uniform magnetic field as claimed in claim 3, wherein respective compensation blocks of a first pair at least partially abut the respective surfaces of the wedge-shaped blocks that are remote from the origin.

5. A magnetic structure generating a uniform magnetic field as claimed in claim 3, wherein respective compensation blocks of a first pair completely abut the respective surfaces of the wedge-shaped blocks that are remote from the origin.

6. A magnetic structure generating a uniform magnetic field as claimed in claim 3, wherein the orientation of the magnetizations of respective compensation blocks of a first pair are substantially parallel to the magnetizations of respective ones of the wedge-shaped blocks.

7. A magnetic structure generating a uniform magnetic field as claimed in claim 3, wherein respective compensation blocks of a first pair are spaced from the respective surfaces of the wedge-shaped blocks that are remote from the origin.

8. A magnetic structure generating a uniform magnetic field as claimed in claim 3, wherein the compensation means comprises two pairs of compensation blocks, with respective blocks of a first pair spaced from respective blocks of a second pair.

9. A magnetic structure generating a uniform magnetic field as claimed in claim 8, wherein the second pair of compensation blocks positioned further from the z axis than that of the wedge-shaped blocks is larger than the first pair of compensation blocks.

10. A magnetic structure generating a uniform magnetic field as claimed in claim 3, wherein the ratio of the magnetizations of the compensation blocks to that of the wedge-shaped blocks is 3:1.

11. A magnetic structure generating a uniform magnetic field as claimed in claim 3, wherein the compensation blocks are of a rare earth magnetic material, and the wedge-shaped blocks are of a hard ferrite magnetic material.

12. A magnetic structure generating a uniform magnetic field as claimed in claim 3, wherein the opening defined by the first sides of the wedge-shaped blocks and compensation blocks is up to $2\pi$ steradians and the field strength in the region of interest is of the order of 0.2 T or greater.

13. A magnetic structure for generating a uniform magnetic field within a region of interest as claimed in claim 3, wherein each of the wedge-shaped blocks has a triangular cross-section forming in addition to the first and second major sides a third side opposite the first angle, said third side of each wedge-shaped block being parallel to the orientation of its magnetization J.

14. A magnetic structure for generating a uniform magnetic field within a region of interest as claimed in claim 3, wherein the compensation blocks and the wedge-shaped blocks are constituted of different magnetic materials.

15. A magnetic structure generating a substantially uniform magnetic field as claimed in claim 3, wherein the value of $\alpha$ is determined by the value of both $\phi_a$ and $\phi_b$.

16. A magnetic structure generating a uniform magnetic field as claimed in claim 15, wherein the orientation of the magnetizations of respective compensation blocks of a first pair are directed at an angle $\gamma$ with respect to the magnetizations of respective ones of the wedge-shaped blocks, where $\gamma < \alpha$.

17. A magnetic structure generating a uniform magnetic field as claimed in claim 15, wherein $\phi_a = 60°$ and $\phi_b = 90°$.

18. A magnetic structure generating a uniform magnetic field as claimed in claim 15, wherein $\phi_a = 60°$ and $\alpha = 120°$.

19. A magnetic structure for generating a uniform magnetic field within a region of interest as claimed in claim 15, wherein $\alpha = \phi_b$.

20. A magnetic structure for generating a uniform magnetic field within a region of interest as claimed in claim 15, wherein $\alpha = \pi/2$.

21. A magnetic structure for generating a uniform magnetic field within a region of interest as claimed in claim 15, wherein $\alpha = \frac{1}{2}(\phi_b - \phi_a + \pi)$.

22. A magnetic structure for generating a uniform magnetic field within a region of interest as claimed in claim 15, wherein $\alpha = (\phi_b - \phi_a + \pi/2)$.

23. A magnetic structure generating a uniform magnetic field as claimed in claim 15, wherein $\alpha = 90°$.

* * * * *